US011490499B2

(12) United States Patent
Jang et al.

(10) Patent No.: US 11,490,499 B2
(45) Date of Patent: Nov. 1, 2022

(54) METHOD OF EXPOSURE USING EXTREME ULTRAVIOLET AND METHOD OF MANUFACTURING A SEMICONDUCTOR DEVICE USING THE SAME

(71) Applicant: SAMSUNG ELECTRONICS CO., LTD., Suwon-si (KR)

(72) Inventors: Sungho Jang, Hwaseong-si (KR); Yoonjae Kim, Seongnam-si (KR); Hyuck Shin, Bucheon-si (KR); Donghyub Lee, Seoul (KR); Kul Inn, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 51 days.

(21) Appl. No.: 17/242,022

(22) Filed: Apr. 27, 2021

(65) Prior Publication Data

US 2022/0070992 A1     Mar. 3, 2022

(30) Foreign Application Priority Data

Aug. 28, 2020    (KR) .................. 10-2020-0109471

(51) Int. Cl.
*H05G 2/00*     (2006.01)
*G03F 7/20*     (2006.01)
*H01S 3/223*     (2006.01)

(52) U.S. Cl.
CPC ........ *H05G 2/008* (2013.01); *G03F 7/70033* (2013.01); *H01S 3/2232* (2013.01); *H05G 2/003* (2013.01)

(58) Field of Classification Search
CPC .... H05G 2/008; H05G 2/003; G03F 7/70033; H01S 3/2232
See application file for complete search history.

(56) References Cited

U.S. PATENT DOCUMENTS

| | | | |
|---|---|---|---|
| 6,882,704 B2 | 4/2005 | Schriever et al. |
| 8,557,611 B2 | 11/2013 | Shirai |
| 9,188,485 B1 | 11/2015 | Kim et al. |
| 9,239,269 B1 | 1/2016 | Liu et al. |
| 2008/0149862 A1 | 6/2008 | Hansson et al. |
| 2009/0161201 A1 | 6/2009 | Ershov et al. |
| 2010/0193710 A1 | 8/2010 | Wakabayashi et al. |
| 2011/0079736 A1 | 4/2011 | Hansson et al. |
| 2013/0321901 A1 | 12/2013 | Ershov et al. |
| 2014/0264087 A1 | 9/2014 | Rafac et al. |
| 2018/0124906 A1 | 5/2018 | Tao et al. |
| 2020/0137864 A1 | 4/2020 | Su et al. |

FOREIGN PATENT DOCUMENTS

JP          6153123 B2     6/2017

*Primary Examiner* — Nicole M Ippolito
*Assistant Examiner* — Hanway Chang
(74) *Attorney, Agent, or Firm* — Volentine, Whitt & Francos, PLLC (57) ABSTRACT

A method of manufacturing a semiconductor includes generating plasma in an amplifying tube using gas as a gain medium; detecting a state of the plasma generated in the amplifying tube; determining a virtual laser gain based on the detected state of the plasma; controlling the state of the plasma such that the virtual laser gain is within a target range; and manufacturing the semiconductor device including performing an exposure process on a substrate using a laser beam output from the amplifying tube adjusted to have the virtual laser gain within the target range.

20 Claims, 8 Drawing Sheets

METHOD OF EXPOSURE USING EXTREME ULTRAVIOLET AND METHOD OF MANUFACTURING A SEMICONDUCTOR DEVICE USING THE SAME

CROSS-REFERENCE TO RELATED APPLICATION

A claim of priority under 35 U.S.C. § 119 is made to Korean Patent Application No. 10-2020-0109471, filed on Aug. 28, 2020, in the Korean Intellectual Property Office, the entirety of which is hereby incorporated by reference.

BACKGROUND

The present disclosure relates to a method of exposure using extreme ultraviolet, and a method of manufacturing a semiconductor device using the same.

Photolithography techniques including exposure processes and development processes are used to manufacture semiconductor devices on a wafer. Extreme ultraviolet (EUV) light has been used as a light source of an exposure device to form fine patterns consistent with the trend of downsizing semiconductor devices. EUV light may be generated using light emitted by plasma, e.g., laser-produced plasma (LPP) or discharge-produced plasma (DPP). EUV light may be generated according to an LPP method by reacting a high-power laser beam with a target material. However, the unstable output of a laser beam used to generate EUV light causes deterioration of the reliability of an exposure process.

SUMMARY

Embodiments of the inventive concepts provide an extreme ultraviolet (EUV) exposure method with improved stability and consistency of a laser beam output state and a method of manufacturing a semiconductor device using the same.

Embodiments of the inventive concepts provide a method of manufacturing a semiconductor device, the method including generating plasma in an amplifying tube by using gas as a gain medium; detecting a state of the plasma generated in the amplifying tube; determining a virtual laser gain based on the detected state of the plasma; controlling the state of the plasma such that the virtual laser gain is within a target range; and manufacturing the semiconductor device, including performing an exposure process on a substrate using a laser beam output from the amplifying tube adjusted to have the virtual laser gain within the target range.

Embodiments of the inventive concepts further provide an EUV exposure method including generating plasma in an amplifying tube to output a laser beam; detecting an actual laser gain by measuring power of the laser beam with a power meter; detecting a spectrum of light emitted from the amplifying tube responsive to the plasma by using a spectrometer; generating a plurality of laser gain variable candidates based on a single wavelength or a combination of two or more wavelengths selected from the spectrum of light detected by the spectrometer; determining a laser gain variable having a correlation equal to or higher than a predetermined percentage value with the actual laser gain from among the plurality of laser gain variable candidates; determining a virtual laser gain for the amplifying tube based on the determined laser gain variable; and performing an EUV exposure using a laser beam output from the amplifying tube adjusted to have the virtual laser gain.

Embodiments of the inventive concepts still further provide an EUV exposure method including supplying a mixed gas into an amplifying tube; generating plasma by applying RF power to an electrode in the amplifying tube supplied with the mixed gas; detecting a state of the plasma generated in the amplifying tube; determining a virtual laser gain based on the detected state of the plasma; controlling the state of the plasma such that the virtual laser gain is within a target range; and generating EUV light by reacting droplets with a laser beam output from the amplifying tube when the virtual laser gain is within the target range.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
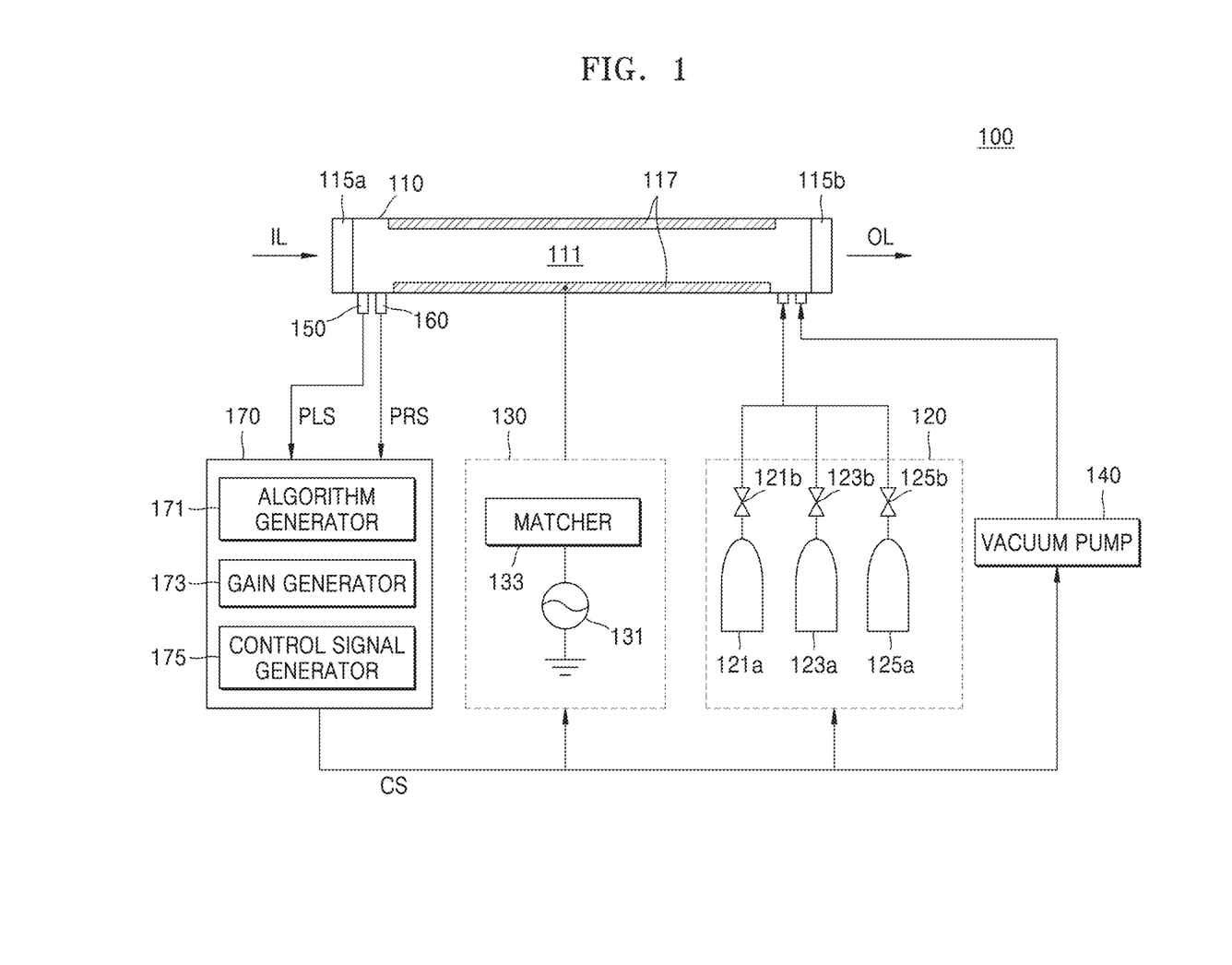
FIG. 1 illustrates a block diagram of a laser amplifying device according to example embodiments of the inventive concepts.

FIG. 1 illustrates a block diagram of a laser amplifying device 100 according to example embodiments of the inventive concepts.

Referring to FIG. 1, the laser amplifying device 100 may include an amplifying tube 110, a gas supply 120, electrode 117, a power supply 130, a vacuum pump 140, a first mirror 115a, a second mirror 115b, a plasma sensor 150, a pressure sensor 160, and a controller 170.

The laser amplifying device 100 is a device configured to amplify an input laser beam IL input to the amplifying tube 110 by using a gain medium. The laser amplifying device 100 may output an output laser beam OL having an output power from several kW to tens of kW as needed. Although FIG. 1 shows that the laser amplifying device 100 includes one amplifying tube 110, the laser amplifying device 100 may include two or more amplifying tubes 110 connected in series. Each of the two or more amplifying tubes 110 connected in series may individually amplify laser beams.

In example embodiments, the laser amplifying device 100 may be configured to output a gas laser beam using a gas as a gain medium. For example, the laser amplifying device 100 may be configured to output a carbon dioxide laser beam, a helium-neon laser beam, a nitrogen laser beam, an excimer laser beam, etc.

The output laser beam OL output from the laser amplifying device 100 may be used in a semiconductor manufacturing process, e.g., an extreme ultraviolet (EUV) exposure process. In example embodiments, the laser amplifying device 100 may be configured to output the output laser beam OL of particular wavelengths used to generate EUV light used in EUV exposure processes.

The amplifying tube 110 may provide an inner space 111 capable of accommodating a gas or plasma therein. The inner space 111 of the amplifying tube 110 may be a sealable space. For example, the amplifying tube 110 may have a cylindrical shape extending in a linear direction. At least a portion of the amplifying tube 110 may include a transparent material (e.g., glass) to enable analysis of light emitted to the outside of the amplifying tube 110.

The gas supply 120 may supply a gas as a gain medium to the inner space 111 of the amplifying tube 110. The gas supply 120 may be configured to supply a mixed gas in which two or more gases are mixed to the amplifying tube 110. The gas supply 120 may include gas tanks respectively storing different gases and flux controllers configured to adjust the flux of gases supplied from respective gas tanks. The flux controller may include for example an electronic control valve (e.g., a solenoid valve), a mass flux controller, etc.

In example embodiments, the laser amplifying device 100 may be configured to emit an output laser beam OL having a wavelength of 10.6 μm using carbon dioxide as a gain medium. In this case, the gas supply 120 may include a first gas tank 121a configured to store and supply carbon dioxide, a second gas tank 123a configured to store and supply nitrogen, and a third gas tank 125a configured to store and supply helium, and may further include a first flux controller 121b for controlling the flux of carbon dioxide supplied from the first gas tank 121a, a second flux controller 123b for controlling the flux of nitrogen supplied from the second gas tank 123a, and a third flux controller 125b for controlling the flux of helium supplied from the third gas tank 125a.

The gas supply 120 may be configured to control flux of gases supplied to the amplifying tube 110 to adjust the pressure inside the amplifying tube 110. Also, the gas supply 120 may be configured to control flux of each of the gases supplied to the amplifying tube 110 to adjust the partial pressure of each of the gases in the inner space 111 of the amplifying tube 110.

In example embodiments, a pressure sensor 160 configured to sense pressure inside the amplifying tube 110 may be installed on the amplifying tube 110. The gas supply 120 may be configured to be driven, based on a pressure signal PRS indicative of the pressure in the amplifying tube 110 as sensed by the pressure sensor 160, to adjust the pressure in the amplifying tube 110 or to adjust the partial pressure of each of the gases in the inner space 111 of the amplifying tube 110.

The vacuum pump 140 may be configured to exhaust gas in the amplifying tube 110. The vacuum pump 140 may be connected to the inner space 111 of the amplifying tube 110 through an exhaustion line. The vacuum pump 140 may control the pressure of the inner space 111 of the amplifying tube 110 by exhausting gas from the inner space 111 of the amplifying tube 110. In example embodiments, the vacuum pump 140 may be configured to control the pressure in the amplifying tube 110 by operating based on the pressure signal PRS indicative of the pressure in the amplifying tube 110 as sensed by the pressure sensor 160.

The electrode 117 may be provided in the amplifying tube 110. For example, in the amplifying tube 110, two electrodes 117, which are spaced apart from each other, may be provided. One electrode 117 of the two electrodes 117 may be an electrode to which radio frequency (RF) power is applied from the power supply 130, and the other electrode 117 may be an electrode to which ground power (not shown) is applied. Hereinafter, electrode 117 may be interchangeably referred to as an electrode or as electrodes.

The power supply 130 may apply power to the electrode 117 to excite a gas in the amplifying tube 110. The power supply 130 may be configured to apply, for example, an RF power in the form of an electromagnetic wave having a predetermined frequency and intensity, to the electrode 117. Power supplied from the power supply 130 may be applied to the electrode 117 in the form of continuous waves or in the form of pulses. The power supply 130 may include an RF power source 131, and an impedance matcher 133 provided between the RF power source 131 and the electrode 117.

For example, when RF power and ground power provided from the power supply 130 are supplied to the electrodes 117, an electric field is formed in the amplifying tube 110 and a mixed gas in the amplifying tube 110 is excited, and thus, plasma may be generated.

The first mirror 115a and the second mirror 115b may be respectively arranged at opposite ends of the amplifying tube 110. The first mirror 115a may be a mirror through which the input laser beam IL provided from the outside of the amplifying tube 110 passes, and the second mirror 115b may be a mirror through which the output laser beam OL amplified by the amplifying tube 110 passes. The first mirror 115a may be configured to have a higher reflectivity than the second mirror 115b. For example, the first mirror 115a may correspond to a mirror configured to totally reflect light, and the second mirror 115b may correspond to a mirror configured to partially transmit light therethrough. The first mirror 115a and the second mirror 115b may each be, for example, a copper mirror, a silicon mirror, a molybdenum mirror, or an aluminum mirror.

The plasma sensor 150 may be configured to detect states of plasma inside the amplifying tube 110. For example, the plasma sensor 150 may include various sensors or measuring devices for detecting temperature, pressure, density, wavelength, etc. of the plasma inside the amplifying tube 110.

In example embodiments, the plasma sensor 150 may include a spectrometer provided on the outer wall of the amplifying tube 110. The spectrometer may detect the spectrum of light emitted from the amplifying tube 110. The spectrometer may be configured to detect spectrum intensity generated at a particular wavelength by converting light emitted from the amplifying tube 110 into a spectrum. The spectrometer may calculate spectrum intensity corresponding to a particular wavelength by converting an amount of light or energy of light corresponding to the particular wavelength in a detected spectrum into a numerical value according to a predetermined algorithm. When plasma is generated in the amplifying tube 110, various atoms and molecules constituting the plasma emit light having unique wavelengths. For example, wavelengths such as 643.6 µm and 645.6 µm may be detected in the spectrum of carbon monoxide (CO), and wavelengths such as 727.6 µm and 646.4 µm may be detected in the spectrum of nitrogen. Therefore, information regarding the density of particular atoms and molecules in the plasma may be obtained from spectrums detected by the spectrometer.

The controller 170 may feedback-control the output laser beam OL (i.e., provide feedback control of the output laser beam OL) in real time based on a plasma state signal PLS detected by the plasma sensor 150. For example, based on the plasma state signal PLS detected by the plasma sensor 150, to control the state of plasma related to the characteristics of the output laser beam OL, the controller 170 may control operations of components of the laser amplifying device 100 that affect the states of the plasma.

For example, the controller 170 may generate a control signal CS for adjusting fluxes of gases supplied to the amplifying tube 110 based on the plasma state signal PLS detected by the plasma sensor 150, and may apply the control signal CS to the gas supply 120. The gas supply 120 may adjust the respective fluxes of gases supplied to the amplifying tube 110 based on the control signal CS applied from the controller 170, thereby adjusting a gas composition or a gas partial pressure in the amplifying tube 110 or adjusting the pressure in the amplifying tube 110.

For example, the controller 170 may apply the control signal CS to the vacuum pump 140 based on the plasma state signal PLS detected by the plasma sensor 150, such that the pressure in the amplifying tube 110 is adjusted. The vacuum pump 140 may adjust the pressure in the amplifying tube 110 by adjusting an amount of exhaust based on the control signal CS applied from the controller 170.

For example, the controller 170 may provide the control signal CS for controlling RF power applied to the electrode 117 to the power supply 130, based on the plasma state signal PLS detected by the plasma sensor 150.

The controller 170 may be implemented with hardware, firmware, software, or any combination thereof. For example, the controller 170 may be a computing device such as a workstation computer, a desktop computer, a laptop computer, and a tablet computer or the like. For example, the controller 170 may include a memory device such as read only memory (ROM) and random access memory (RAM), and a processor configured to perform predetermined operations and algorithms, e.g., a microprocessor, a CPU, a GPU. Also, the controller 170 may include a receiver and a transmitter for receiving and transmitting electrical signals.

In example embodiments, the controller 170 may include an algorithm generator 171, a gain generator 173, and a control signal generator 175.

The algorithm generator 171 may generate a laser gain calculation algorithm that may be used to determine the laser gain of the laser amplifying device 100 based on the plasma state signal PLS detected by the plasma sensor 150. The algorithm generator 171 may include a processor (not shown) capable of generating a laser gain calculation algorithm by processing the plasma state signal PLS transmitted from the plasma sensor 150, and a memory device (not shown) capable of storing the generated laser gain calculation algorithm.

The gain generator 173 may determine a virtual laser gain by using the laser gain calculation algorithm generated by the algorithm generator 171 and the plasma state signal PLS detected by the plasma sensor 150. The laser gain may refer to a ratio between the power of the input laser beam IL and the power of the output laser beam OL. Here, the virtual laser gain is distinguished from an actual laser gain which is calculated based on a value obtained by actually detecting at least a part of the output laser beam OL. The virtual laser gain may refer to a laser gain indirectly obtained by using a state of plasma without actually detecting the output laser beam OL or a part thereof. The gain generator 173 may include a processor capable of performing a predetermined operation.

The control signal generator 175 may determine whether the virtual laser gain obtained by the gain generator 173 is within a predetermined target range, and may generate a control signal CS for controlling the state of the plasma in the amplifying tube 110 according to a result of the determination. The control signal CS generated by the control signal generator 175 may be applied to components capable of controlling factors affecting the state of the plasma in the amplifying tube 110. For example, the control signal generator 175 may apply the control signal CS to at least one of the gas supply 120, the power supply 130, and the vacuum pump 140. The control signal generator 175 may include a processor capable of performing a predetermined operation.

Generally, in order to diagnose an output state of a laser beam, a method of separating a part of the output laser beam and directly measuring a separated part of the laser beam using a predetermined measuring device may be used. In the case of such a direct measurement method, because a part of an output laser beam is separated, perturbation may occur in the output laser beam, and the reliability of a laser diagnosis result may deteriorate due to age related change or age related deterioration of the predetermined measuring device over time.

However, according to example embodiments of the inventive concepts, a state of plasma used for amplification of a laser beam is detected, and laser gain is detected by using information regarding the detected state of the plasma and a laser gain calculation algorithm. In this case, an output state of the output laser beam OL may be diagnosed in a manner that does not perturb the output laser beam OL, and errors in laser beam diagnosis due to age related change or age related deterioration of a measuring device for directly measuring the output laser beam OL may be eliminated. Therefore, the reliability of a result of the laser beam diagnosis may be improved. Furthermore, by controlling a laser beam output state in real time based on a result of a laser beam diagnosis having improved reliability, the consistency and the stability of a laser beam output may be improved.

Figure 2:
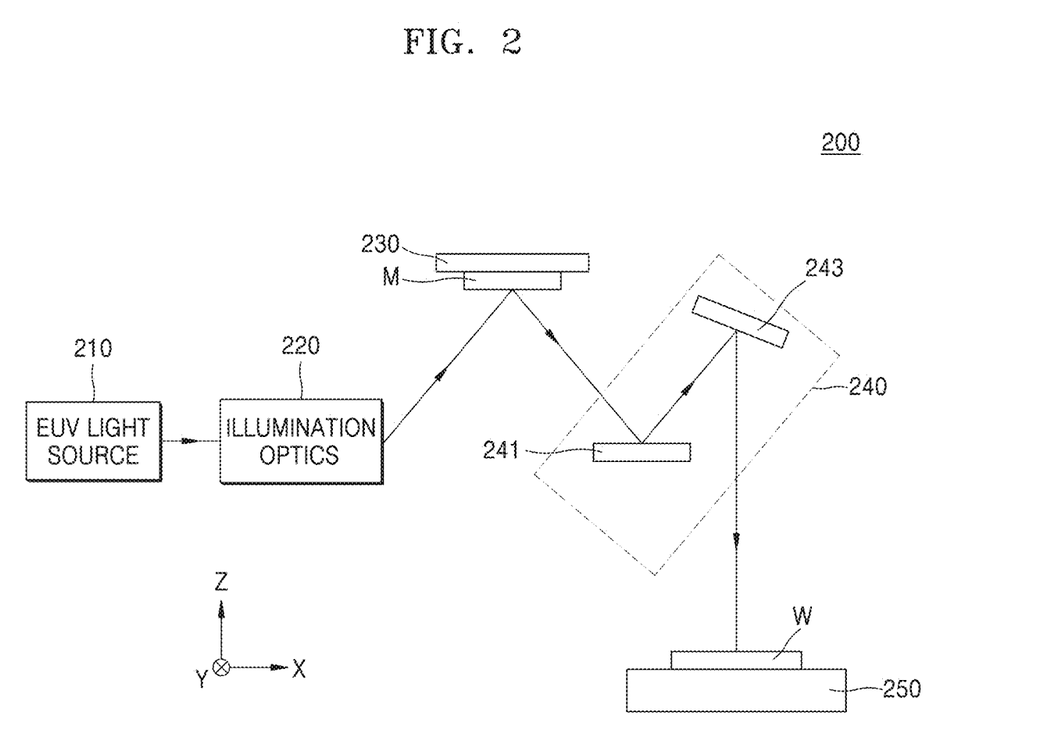
FIG. 2 illustrates a block diagram schematically showing an Extreme ultraviolet (EUV) exposure device according to example embodiments of the inventive concepts.
Figure 3:
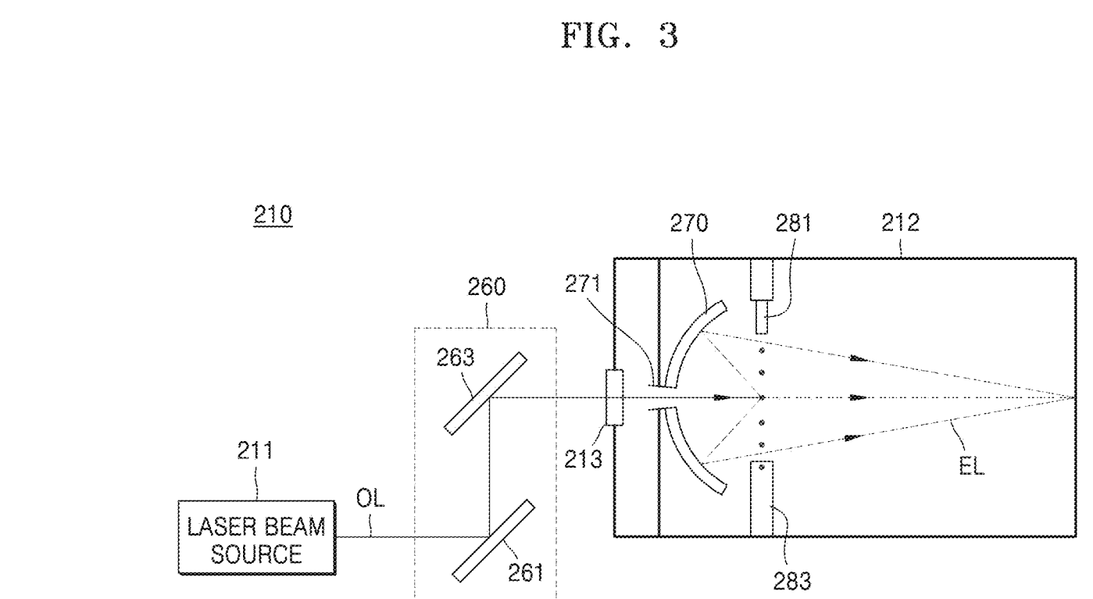
FIG. 3 illustrates a schematic diagram of an EUV light source of FIG. 2.

FIG. 2 illustrates a block diagram schematically showing an EUV exposure device 200 according to example embodiments of the inventive concepts. FIG. 3 illustrates a schematic diagram showing an EUV light source 210 of FIG. 2.

Referring to FIGS. 2 and 3, the EUV exposure device 200 may include the EUV light source 210, illumination optics 220, a mask support 230, projection optics 240, and a substrate stage 250.

The EUV light source 210 may generate and output EUV light EL having a high energy density. For example, the EUV light EL radiated from the EUV light source 210 may have a wavelength between 4 nm and 124 nm. In some embodiments, the EUV light EL may have a wavelength between 4 nm and 20 nm. In some embodiments, the EUV light EL may have a wavelength of 13.5 nm.

The EUV light source 210 may be a plasma-based light source or a synchrotron radiation light source. Here, the plasma-based light source refers to a light source that generates plasma and uses light emitted by the plasma, and may include a laser-produced plasma (LPP) light source or a discharge-produced plasma (DPP) light source. In the EUV exposure device 200 of the present embodiment, the EUV light source 210 may be, for example, a plasma-based light source. However, it should be understood that in embodiments of the inventive concepts, the EUV light source 210 of the EUV exposure device 200 is not limited to a plasma-based light source.

Referring to FIG. 3, the EUV light source 210 may include a laser beam source 211, transmission optics 260, a vacuum chamber 212, a collector mirror 270, a droplet generator 281, and a droplet catcher 283.

The laser beam source 211 may include the laser amplifying device 100 described above with reference to FIG. 1, and a light source that provides seed light to the laser amplifying device 100. The laser beam source 211 may be configured to output an output laser beam OL. For example, the laser beam source 211 may output a carbon dioxide laser beam. The output laser beam OL output from the laser beam source 211 is incident to a window 213 of the vacuum chamber 212 through a plurality of reflective mirrors 261 and 263 included in the transmission optics 260, and may be introduced into the vacuum chamber 212 via the window 213 of the vacuum chamber 212.

In the center of the collector mirror 270, an aperture 271 is provided through which the output laser beam OL may pass, and thus, the output laser beam OL may be introduced into the vacuum chamber 212 through the aperture 271 of the collector mirror 270.

The droplet generator 281 may generate droplets that generate EUV light EL by interacting with the output laser beam OL and may provide the droplets into the vacuum chamber 212. The droplets may for example include at least one of tin (Sn), lithium (Li), and xenon (Xe). For example, the droplets may include at least one of Sn, a tin compound (e.g., $SnBr_4$, $SnBr_2$, or SnH), and a tin alloy (e.g., Sn—Ga, Sn—In, or Sn—In—Ga). The droplet catcher 283 is located below the droplet generator 281 and may be configured to collect droplets not reacting with the output laser beam OL. The droplets provided from the droplet generator 281 may react with the output laser beam OL introduced into the vacuum chamber 212 and generate EUV light EL. The collector mirror 270 may collect and reflect the EUV light EL, thereby emitting the EUV light EL to the illumination optics 220 provided outside the vacuum chamber 212.

Referring to FIG. 2, the illumination optics 220 may include a plurality of mirrors and may transmit the EUV light EL from the EUV light source 210 to an EUV mask M. For example, the EUV light EL from the EUV light source 210 may be incident on the EUV mask M that may be provided on a mask support 230 through reflection by mirrors in the illumination optics 220.

The EUV mask M may be a reflective mask having a reflective area and a non-reflective and/or intermediate reflective area. The EUV mask M may include a reflective multilayer for reflecting EUV light on a substrate including a low thermal expansion coefficient material (LTEM) such as quartz, and an absorption layer formed on the reflective multilayer. The reflective multilayer may have, for example, a structure in which tens of molybdenum (Mo) layers and tens of silicon (Si) layers are alternately stacked. The absorption layer may include, for example, TaN, TaNO, TaBO, Ni, Au, Ag, C, Te, Pt, Pd, Cr, etc. However, the materials constituting the reflective multilayer and the materials constituting the absorption layer are not limited to the above-stated materials. Here, the absorption layer may correspond to the non-reflective and/or intermediate reflective region.

The EUV mask M reflects the EUV light EL incident through the illumination optics 220, such that the EUV light EL is incident on the projection optics 240. More particularly, the EUV mask M constructs light incident from the illumination optics 220 as projection light based on the shape of a pattern including the reflective multilayer and the absorption layer on a substrate, and makes the incident projection light be incident on the projection optics 240. The projection light may be constructed through at least a second diffraction order based on a pattern on the EUV mask M. Such projection light may be incident on the projection optics 240 while holding shape information regarding the pattern on the EUV mask M and may pass through the projection optics 240, and may form an image that corresponds to the pattern of the EUV mask M on an exposure target W. Here, the exposure target W may be a substrate including a semiconductor material like silicon (e.g., a wafer).

The exposure target W may be placed on the substrate stage 250. The substrate stage 250 may move in an X direction and a Y direction on an X-Y plane and may also move in a Z direction perpendicular to the X-Y plane. Therefore, due to the movement of the substrate stage 250, the exposure target W may also be moved in the X direction, the Y direction, and the Z direction.

The projection optics 240 may include a plurality of mirrors 241 and 243. Although FIG. 2 shows only two mirrors 241 and 243 in the projection optics 240, it is merely for convenience of illustration, and the projection optics 240 may include more mirrors. For example, the projection optics 240 may generally include 4 to 8 mirrors. It should be understood that the number of mirrors included in the projection optics 240 is not limited to 2, 4 or 8 as described.

Figure 4:
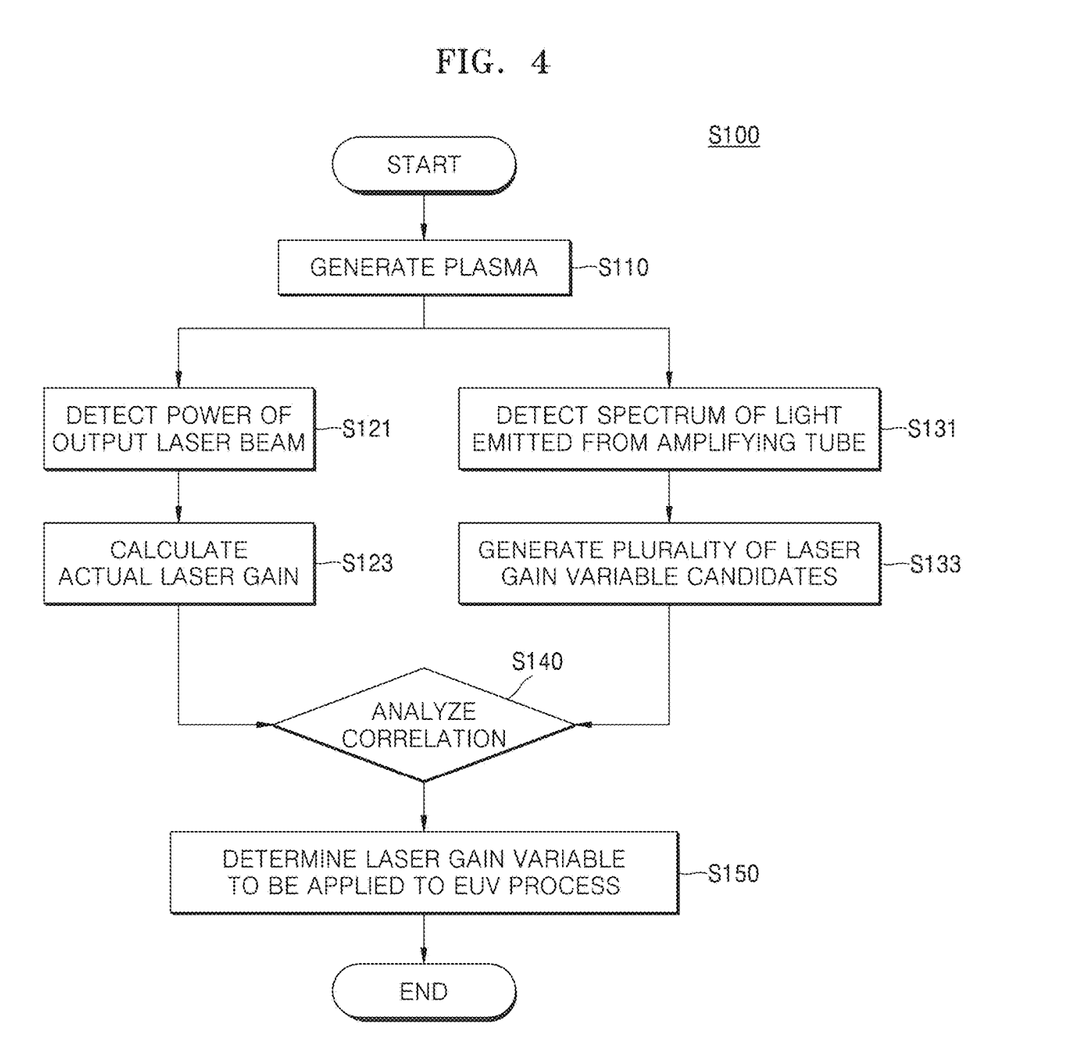
FIG. 4 illustrates a flowchart of a method of generating a laser gain calculation algorithm according to example embodiments of the inventive concepts.
Figure 5:
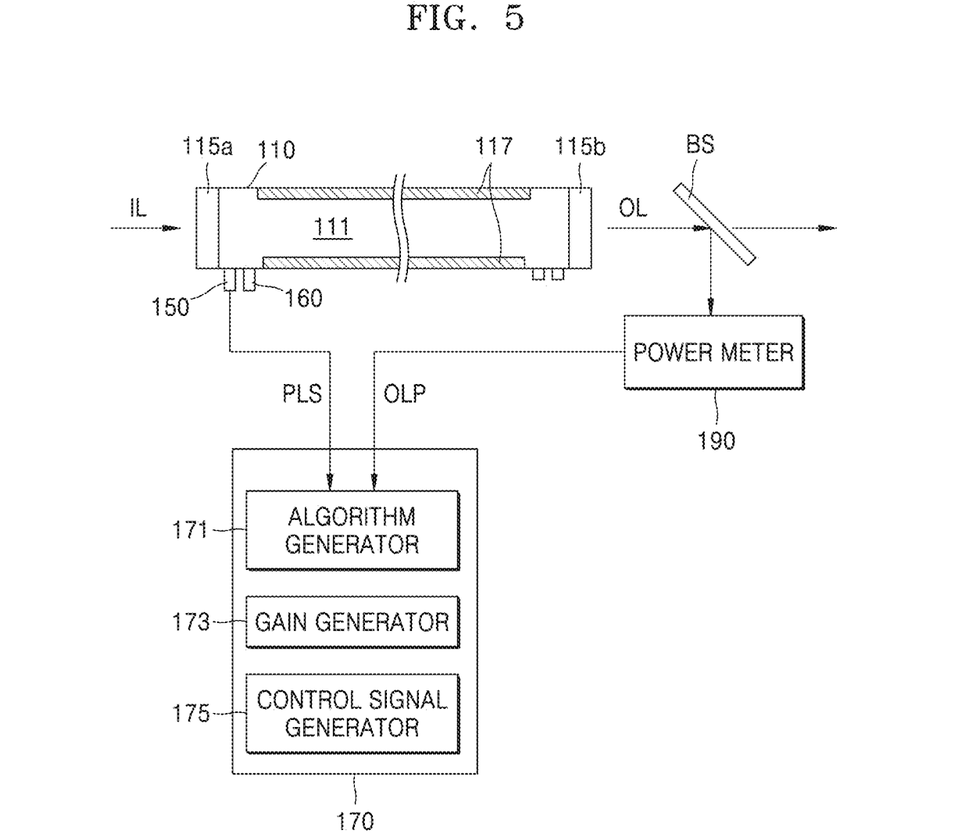
FIG. 5 illustrates a conceptual diagram schematically showing a process of generating a laser gain calculation algorithm in the laser amplifying device of FIG. 1.
Figure 6:
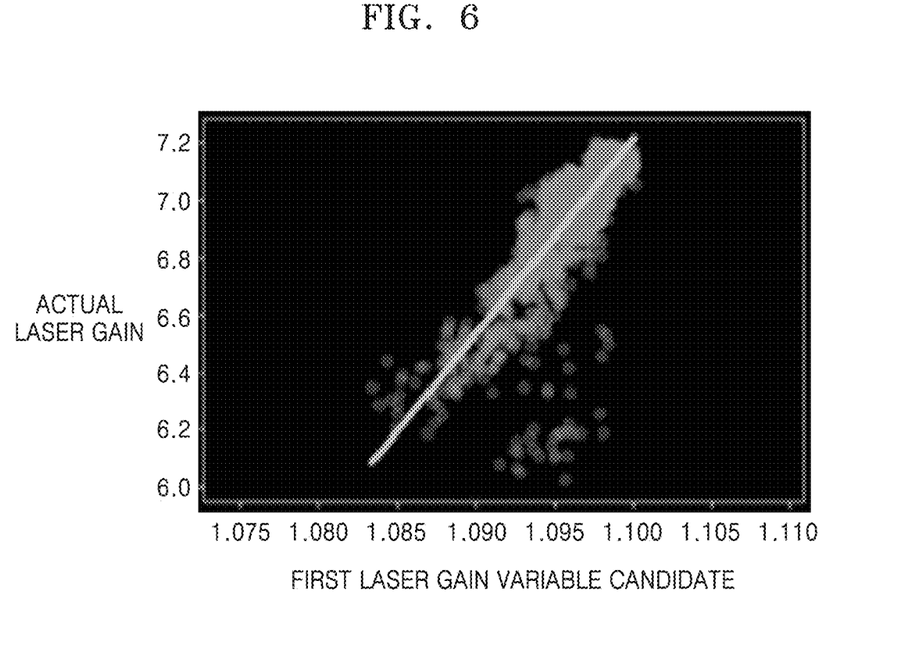
FIG. 6 illustrates a graph showing a correlation between a laser gain and a laser gain variable obtained by the laser gain calculation algorithm.

FIG. 4 illustrates a flowchart of a method S100 of generating a laser gain calculation algorithm according to example embodiments of the inventive concepts. FIG. 5 illustrates a conceptual diagram schematically showing a process of generating a laser gain calculation algorithm in the laser amplifying device 100 of FIG. 1. FIG. 6 illustrates a graph showing a correlation between a laser gain and a laser gain variable obtained by the laser gain calculation algorithm.

Hereinafter, embodiments of the inventive concepts will be described as including the laser amplifying device 100 outputting a carbon dioxide laser beam using carbon dioxide, nitrogen, and helium as gain media. However, the inventive concepts are not limited to a carbon dioxide laser beam, and may also be applied to a gas laser beam such as for example a helium-neon laser beam, a nitrogen laser beam, and an excimer laser beam or other types.

Referring to FIG. 4 together with FIG. 1, a mixed gas of carbon dioxide, nitrogen, and helium is supplied into the amplifying tube 110 from gas supply 120, and RF power is applied to the electrode 117 from power supply 130 to generate plasma in the amplifying tube 110 (operation S110). This may be characterized as generating evaluation plasma.

In operation S110, when the RF power is supplied to excite the mixed gas including carbon dioxide, nitrogen, and helium, nitrogen molecules are excited to an excited state and obtain energy similar to a particular energy level of carbon dioxide. The nitrogen molecules excited to the excited state collide with carbon dioxide molecules, and the carbon dioxide molecules colliding with the excited nitrogen molecules may be pumped to have the particular energy level. A carbon dioxide laser beam (i.e., the output laser beam OL having a wavelength of 10.6 μm) may be emitted while the carbon dioxide molecules pumped to the particular energy level are being transited to an energy level lower than the particular energy level.

In operation S110, because the power of the output laser beam OL is proportional to the density of the carbon dioxide molecules having the particular energy level, a laser gain may have a proportional relationship with the density of the carbon dioxide molecules having the particular energy level. At this time, the density of the carbon dioxide molecules having the particular energy level may be determined by the density and electron energy distributions of various species (e.g., neutral species, radicals, ions, and electrons) constituting plasma.

Next, referring to FIGS. 4 and 5, the power of the output laser beam OL is detected by using a power meter 190 (operation S121) and the spectrum of light emitted by the amplifying tube 110 is detected by using a spectrometer (operation S131). Operation S121 and operation S131 may be performed simultaneously.

In operation S121, to detect the power of the output laser beam OL, a part of the output laser beam OL may be separated by using a beam splitter BS, and the power of the part of the output laser beam OL may be measured by using the power meter 190.

In operation S131, the spectrometer (e.g., the plasma sensor 150 as previously described) may detect spectrum intensity generated at a particular wavelength by converting light emitted from the amplifying tube 110 into a spectrum. Information regarding spectrum intensity for respective wavelengths may be obtained from a spectrum obtained from the light emitted from the amplifying tube 110.

Next, by using a signal OLP indicative of the power of the output laser beam OL detected through operation S121, the algorithm generator 171 may calculate a laser gain (operation S123). The laser gain obtained in operation S123 may be an actual laser gain obtained based on values measured by actually detecting the output laser beam OL.

Next, the algorithm generator 171 generates a plurality of laser gain variable candidates based on various combinations of different wavelengths appearing from the spectrum of the light detected in operation S131 (operation S133).

Laser gain variable candidates may be spectrum intensities generated at a single wavelength selected from the detected spectrum or values calculated based on spectrum intensities generated at a plurality of wavelengths selected from the detected spectrum. For example, when the laser gain variable candidates are generated based on spectrum intensities of two wavelengths, the laser gain variable candidates may be a ratio between spectrum intensities generated at the two wavelengths.

Next, the algorithm generator 171 analyzes a correlation between the actual laser gain generated in operation S123 and the laser gain variable candidates generated in operation S133 (operation S140).

In operation S140, the algorithm generator 171 calculates a correlation between each of the laser gain variable candidates and the actual laser gain. For example, when each of the laser gain variable candidates is generated based on a spectrum intensity of a single wavelength, the algorithm generator 171 analyzes a correlation between the spectrum intensity generated at the single wavelength and the actual laser gain. For example, when each of the laser gain variable candidates is generated based on a ratio between spectrum intensities of two wavelengths, the algorithm generator 171 analyzes a correlation between the ratio between spectrum intensities generated at the two wavelengths and the actual laser gain.

Next, the algorithm generator 171 determines a laser gain variable having a high correlation with the actual laser gain from among the laser gain variable candidates according to a result of the correlation analysis performed in operation S140 (operation S150).

In operation S150, the algorithm generator 171 may determine a laser gain variable having a correlation with an actual laser gain equal to or higher than a predetermined value from among the laser gain variable candidates. For example, a determined laser gain variable may have a linear correlation with the actual laser gain, and the correlation therebetween may be 65% or higher, or may be 75% or higher. For example, the determined laser gain variable may have a linear correlation with the actual laser gain, and a correlation coefficient may be 0.65 or greater or may be 0.75 or greater.

Hereinafter, a method of generating a plurality of laser gain variable candidate based on a combination of two wavelengths, and finally determining a laser gain variable through a correlation analysis between the laser gain variable candidate and an actual laser gain will be exemplified.

First, while a laser beam is amplified in the laser amplifying device shown in FIG. 5, two wavelengths are selected from among a plurality of wavelengths detected by a spectrometer and a plurality of wavelength combination are generated from the selected two wavelengths. For example, the wavelength combination may include a first wavelength combination including a wavelength of 643.6 μm corresponding to the wavelength of the carbon monoxide spectrum (hereinafter referred to as a "first wavelength") and a wavelength of 727.6 μm corresponding to the wavelength of the nitrogen spectrum (hereinafter referred to as a "second wavelength"), a second wavelength combination including a wavelength of 645.2 μm corresponding to the wavelength of the oxygen spectrum (hereinafter referred to as a "third wavelength") and a wavelength of 727.6 μm corresponding to the wavelength of the nitrogen spectrum (hereinafter referred to as a "fourth wavelength"), etc. A first laser gain variable candidate generated from the first wavelength combination is a ratio between a first spectrum intensity corresponding to the first wavelength and a second spectrum intensity corresponding to the second wavelength, and a second laser gain variable candidate generated from the second wavelength combination is a ratio between a third spectrum intensity corresponding to the third wavelength and a fourth spectrum intensity corresponding to the fourth wavelength.

After generating a plurality of wavelength combination, a plurality of tests are performed using the laser amplifying device shown in FIG. 5. The tests are performed to generate a laser gain calculation algorithm. For example, a test that amplifies a laser beam by using the laser amplifying device shown in FIG. 5 may be performed repeatedly from hundreds to tens of thousands of times. In other words, prior to performing operation S140, operation S110, operation S121, operation S123, operation S131, and operation S133, may be performed from hundreds to tens of thousands of times.

For each test, data regarding actual laser gains and the laser gain variable candidates may be obtained. For example, as shown in Table 1 below, data regarding actual laser gains, first laser gain variable candidates, and second laser gain variable candidates may be obtained by performing n (n is a natural number) tests. For reference, the first spectrum intensity corresponding to the first wavelength, the second spectrum intensity corresponding to the second wavelength, the third spectrum intensity corresponding to the third wavelength, and the fourth spectrum intensity corresponding to the fourth wavelength are measured differently in each test, the first laser gain variable candidates and the second laser gain variable candidates may also vary in each test.

TABLE 1

| | first laser gain variable candidate | second laser gain variable candidate | actual laser gain |
|---|---|---|---|
| Test 1 | 1.095 | 1.21 | 6.8 |
| Test 2 | 1.091 | 1.251 | 6.6 |
| . . . | . . . | . . . | . . . |
| Test n | 1.092 | 1.191 | 6.7 |

Next, a correlation analysis between each of the laser gain variable candidates and the actual laser gains is performed.

In the graph of FIG. 6, the X-axis represents first laser gain variable candidates generated according to the first wavelength combination. Also, in the graph of FIG. 6, the Y-axis represents actual laser gains. The graph of FIG. 6 is a scatter plot that shows results obtained by performing multiple tests. The correlation analysis includes statistical correlation analysis algorithms, e.g., the Pearson correlation method, and may be performed by an algorithm generator 171. The graph of FIG. 6 is shown along with a line that represents the correlation between the first laser gain variable candidates and the actual laser gains. For example, the line of the graph shows that, when the first laser gain variable candidate is approximately 1.094, the actual laser gain has a value of 6.8 or a value close thereto.

As shown in the graph of FIG. 6, first laser gain variable candidates generated from the first wavelength combination including the wavelength of 643.6 μm corresponding to the wavelength of the carbon monoxide spectrum and the wavelength of 727.6 μm corresponding to the wavelength of the nitrogen spectrum may exhibit a high correlation of about 70% with respect to the actual laser gains. Carbon monoxide molecules are generated when carbon dioxide molecules having the particular energy level are decomposed, and nitrogen molecules are used to pump carbon dioxide molecules from a low energy level to a higher energy level (that is, the particular energy level). Therefore, the carbon monoxide molecules and the nitrogen molecules may have a high correlation with the density of the carbon dioxide molecules having the particular energy level.

In example embodiments, the first laser gain variable candidates generated from the first wavelength combination including the wavelength of 643.6 μm corresponding to the wavelength of the carbon monoxide spectrum and the wavelength of 727.6 μm corresponding to the wavelength of the nitrogen spectrum may be finally determined as laser gain variables to be applied to an EUV exposure process through the correlation analysis.

The EUV exposure process is performed by an output laser OL amplified by the laser amplifying device 100 of FIG. 1, wherein the laser gain variables determined above may be utilized to check whether the output laser OL is amplified to a target laser gain.

In detail, to obtain the laser gain variable, a ratio between the spectrum intensity corresponding to the wavelength of 643.6 μm and the spectrum intensity corresponding to the wavelength of 727.6 μm may be calculated. When a calculated ratio is out of a target range, a feedback control is performed for adjusting the state of plasma generated in the amplifying tube 110 until the calculated ratio reaches within the target range. For example, referring to the graph of FIG. 6, when a laser gain is to be adjusted to approximately 6.8 and the ratio between the spectrum intensity corresponding to the wavelength of 643.6 μm and the second spectrum intensity corresponding to the wavelength of 727.6 μm is approximately 1.094 plus or minus 5%, it may be determined that the ratio is within the target range. When the calculated ratio reaches within the target range, it indicates that the output laser OL is amplified to the target laser gain, and thus the EUV exposure process is performed by using the output laser OL.

Figure 7:
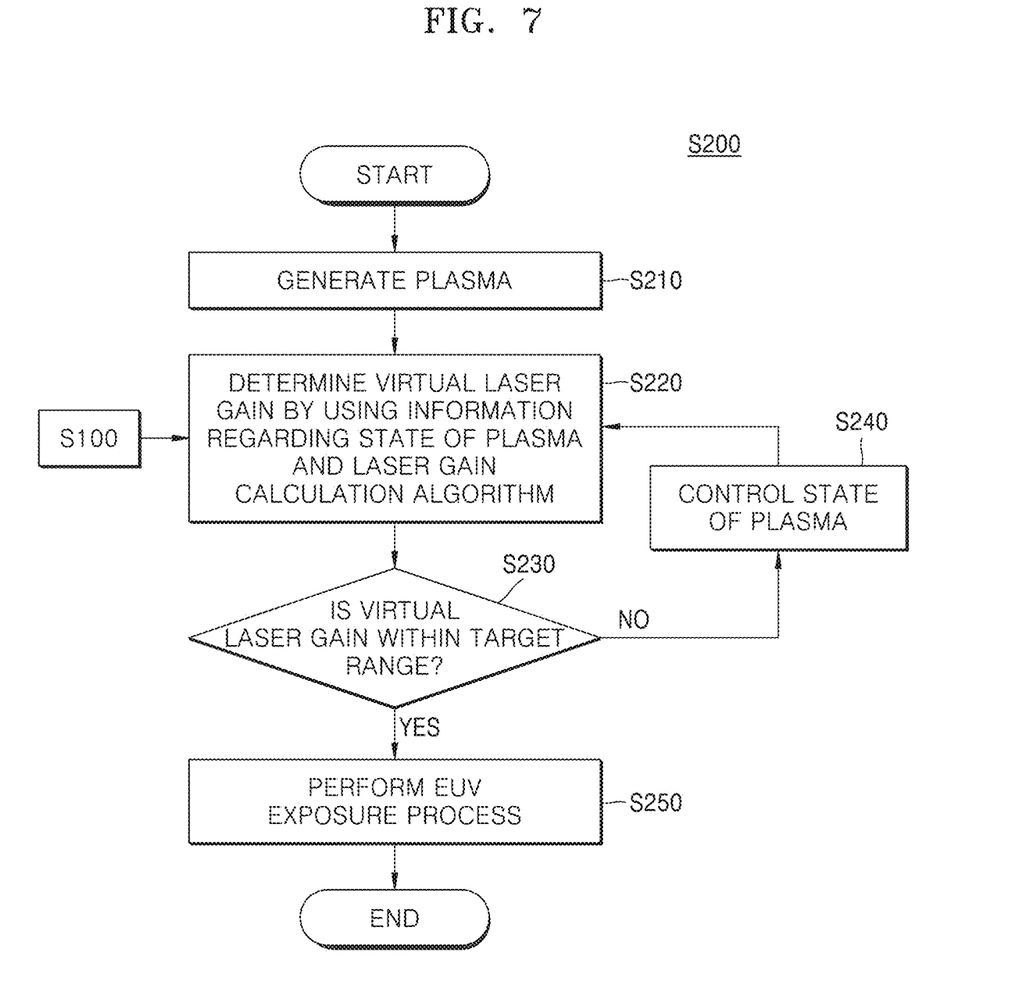
FIG. 7 illustrates a flowchart showing an EUV exposure method including an operation for providing feedback control of an output laser beam according to example embodiments of the inventive concepts.
Figure 8:
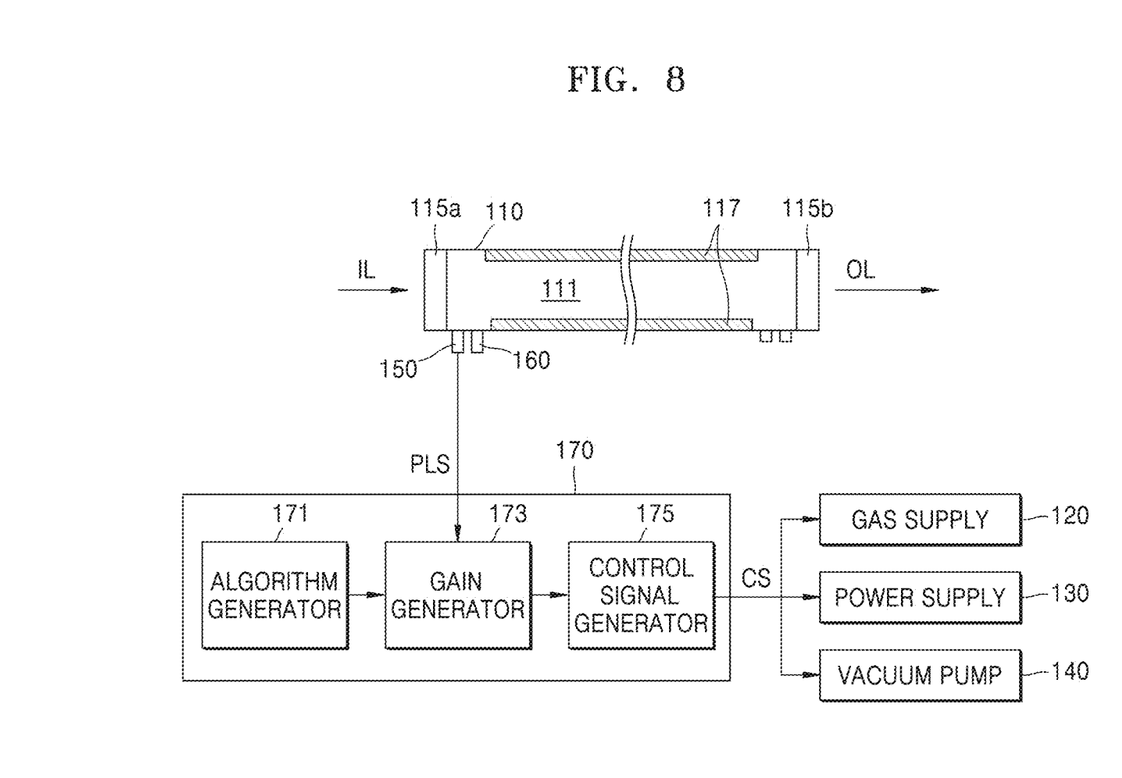
FIG. 8 illustrates a conceptual diagram schematically showing a process of providing feedback control of an output laser beam in the laser amplifying device of FIG. 1.

FIG. 7 illustrates a flowchart showing an EUV exposure method S200 including an operation for providing feedback control of an output laser beam according to example embodiments of the inventive concept. FIG. 8 is a conceptual diagram schematically showing a process of providing feedback control of the output laser beam OL in the laser amplifying device 100 of FIG. 1.

Hereinafter, an EUV exposure method including a method of providing feedback control of an output laser beam using the laser gain calculation algorithm described above with reference to FIGS. 4 to 6 will be described.

Referring to FIG. 7 together with FIG. 1, a mixed gas is supplied into the amplifying tube 110 from the gas supply 120, and RF power is applied to the electrode 117 from the power supply 130 to generate plasma in the amplifying tube 110 (operation S210).

The mixed gas used to generate the plasma in operation S210 may be the same gas combination as a mixed gas used to generate the evaluation plasma when generating the laser gain calculation algorithm (that is, the mixed gas used to generate the plasma in operation S110 of FIG. 4). In other words, the plasma may be generated from a mixed gas of carbon dioxide, nitrogen, and helium.

Next, referring to FIGS. 7 and 8, a virtual laser gain is determined using plasma state information detected by the plasma sensor 150 and the laser gain calculation algorithm obtained in operation S100 (operation S220).

In operation S220, a spectrometer converts light emitted from the amplifying tube 110 into a spectrum and detects spectrum intensity for each wavelength. The gain generator 173 may obtain a laser gain variable from information regarding spectrum intensities for respective wavelengths obtained by the spectrometer. For example, when a laser gain variable determined in operation S100 is a ratio between intensities of spectrums of two particular wavelengths, the gain generator 173 may calculate a ratio between the intensities of the spectrums of the particular two wavelengths in a spectrum detected by the spectrometer, and may determine a virtual laser gain using the calculated ratio between the intensities of the spectrum of the two particular wavelengths.

For example, referring to the graph shown in FIG. 6, the gain generator 173 may obtain a laser gain variable corresponding to a ratio between the spectrum intensities generated at the wavelength of 643.6 μm corresponding to the wavelength of the carbon monoxide spectrum and the spectrum intensities generated at the wavelength of 727.6 μm corresponding to the wavelength of the nitrogen spectrum by using the information regarding spectrum intensities for respective wavelengths obtained by the spectrometer. For example, when the obtained laser gain variable is 1.095, the virtual laser gain of about 6.8 may be determined referring to the graph shown in FIG. 6. The graph and/or the entries of the graph shown in FIG. 6 may be stored in the aforementioned memory device (not shown) of the algorithm generator 171.

Next, referring to FIGS. 7 and 8, it is determined whether the virtual laser gain is within a target range (operation S230). For example, the control signal generator 175 may determine whether the virtual laser gain determined by the gain generator 173 is within a predetermined target range. For example, the target range may be set between +10% and −10% of a target laser gain.

In operation S230, when it is determined that the virtual laser gain is out of the target range, feedback control for adjusting the state of plasma is executed by the controller 170 (operation S240). The feedback control may be executed until the virtual laser gain reaches the target range.

In operation S240, when it is determined that the virtual laser gain is out of the target range, the control signal generator 175 may generate the control signal CS for controlling a factor for controlling the state of plasma, e.g., a gas composition, a partial pressure or a density of a gas, a pressure in the amplifying tube 110, RF power applied to the electrode 117, etc. The control signal generator 175 may apply a generated control signal CS to at least one of the gas supply 120, the power supply 130, and the vacuum pump 140.

For example, the control signal generator 175 may apply the control signal CS to the gas supply 120 to control the operation of the gas supply 120. A flux controller of the gas supply 120 connected to each gas tank may operate according to the control signal CS and adjust the flux of a gas supplied from each gas tank. As the flux of each gas tank is adjusted, the gas composition in the amplifying tube 110 may be adjusted or the pressure in the amplifying tube 110 may be adjusted.

In example embodiments, the control signal generator 175 may receive information regarding a change in the actual laser gain according to a change of a gas composition from a memory device included in the controller 170. The control signal generator 175 may then determine the flux of each gas needed to adjust the virtual laser gain in a desired direction based on provided information, and may control the gas supply 120, such that the determined flux of each gas is satisfied.

Also, in example embodiments, the control signal generator 175 may receive information regarding a change in the actual laser gain according to a change of the pressure in the amplifying tube 110 from a memory device included in the controller 170. The control signal generator 175 may then determine the pressure needed in the amplifying tube 110d to adjust the virtual laser gain in a desired direction based on provided information, and may control the gas supply 120, such that the determined pressure of the amplifying tube 110 is satisfied.

For example, the control signal generator 175 may apply the control signal CS to the power supply 130 to control the operation of the power supply 130. The power supply 130 may operate according to the control signal CS and control the RF power applied to the electrode 117, thereby controlling the state of plasma.

In example embodiments, the control signal generator 175 may receive information regarding a change in the actual laser gain according to a change of the RF power from a memory device included in the controller 170. The control signal generator 175 may then determine the RF power needed to adjust the virtual laser gain in a desired direction based on provided information, and may control the power supply 130 such that the determined RF power is satisfied.

For example, the control signal generator 175 may apply the control signal CS to the vacuum pump 140 to control the operation of the vacuum pump 140. The vacuum pump 140 may control an amount of gas exhausted from the amplifying tube 110 by operating according to the control signal CS, thereby controlling the pressure in the amplifying tube 110.

In example embodiments, the control signal generator 175 may receive information regarding a change in the actual laser gain according to a change of the pressure in the amplifying tube 110 from a memory device included in the controller 170. The control signal generator 175 may then determine the pressure needed in the amplifying tube 110 to adjust the virtual laser gain in a desired direction based on provided information, and may control the vacuum pump 140, such that the determined pressure of the amplifying tube 110 is satisfied.

Meanwhile, in operation S230, when it is determined that the virtual laser gain is within the target range, an EUV exposure process is performed (operation S250).

In operation S250, the laser beam output from the amplifying tube 110 and droplets react with each other to generate EUV light, and the EUV light may be made to be incident on the EUV mask to perform an exposure process on a substrate.

According to example embodiments of the inventive concepts, a laser gain may be determined by using a state of plasma detected by using the plasma sensor 150 and a laser gain calculation algorithm. Because an output state of the output laser beam OL may be diagnosed in a non-perturbation manner that does not perturb the output laser beam OL, errors in laser beam diagnosis due to age related change or age related deterioration of a measuring device for directly measuring the output laser beam OL may be eliminated. Therefore, the reliability of a result of the laser beam diagnosis may be improved. Furthermore, by controlling a laser beam output state in real time based on a result of a laser beam diagnosis with improved reliability, the consistency and the stability of a laser beam output may be improved, and the reliability of an EUV exposure process using the laser beam and a semiconductor manufacturing process including the same may be improved.

Hereinafter, a method of manufacturing a semiconductor structure or device according to embodiments of the inventive concepts will be described.

The method of manufacturing a semiconductor structure or device according to embodiments of the inventive concepts may include a series of semiconductor processes that may be performed on a substrate. The series of semiconductor processes include i) oxidation processes for forming an oxide film, ii) photolithography processes including exposure and development, iii) deposition processes, iv) etching processes, and v) metal wiring processes.

Here, the substrate may be, for example, a wafer. The substrate may include, for example, silicon (Si). The substrate may include a semiconductor element like germanium (Ge) or a compound semiconductor like silicon carbide (SiC), gallium arsenide (GaAs), indium arsenide (InAs), and indium phosphide (InP). According to some embodiments, the substrate may have a silicon-on-insulator (SOI) structure. The substrate may include a buried oxide layer. According to some embodiments, the substrate may include a conductive region, e.g., a well doped with impurities. According to some embodiments, the substrate may have various device isolation structures like a shallow trench isolation (STI) structure separating doped wells from one another.

The oxidation processes may for example include a process of forming a thin and uniform silicon oxide film by chemically reacting oxygen or water vapor with a surface of a silicon substrate at a high temperature from about 800° C. to about 1200° C. The oxidation processes may include dry oxidation and wet oxidation. The dry oxidation may form an oxide film through a reaction with oxygen gas, and the wet oxidation may form an oxide film through a reaction with oxygen and water vapor.

According to some embodiments, an SOI structure may be formed on a substrate through an oxidation process.

The photolithography processes may for example include a process of transferring a circuit pattern formed on a photolithography mask in advance to a substrate through exposure. The photolithography processes may be performed in the order of spin coating, exposure process, and development process. The exposure process may be performed by the laser amplifying device 100 described above with reference to FIG. 1 and the EUV exposure device 200 described above with reference to FIGS. 2 and 3.

The deposition processes may for example include any one of atomic layer deposition (ALD), chemical vapor deposition (CVD), plasma-enhanced CVD (PECVD), metal organic CVD (MOCVD), physical vapor deposition (PVD), reactive pulsed laser deposition method, molecular beam epitaxy, and DC magnetron sputtering.

The etching processes may for example include a dry etching process such as for example any one of reactive ion etching (RIE), deep RIE (DRIE), ion beam etching (IBE), and Ar milling. In another example, a dry etching process that may be performed on a substrate may be atomic layer etching (ALE). Also, the etching processes may include a wet etching process that may be performed on the substrate may be an etching process using at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $SF_6$, $O_2$, $SO_2$, and COS as an etchant gas.

The metal wiring processes may include for example a process of forming a conductive wire (metal line) to implement a circuit pattern for operation of a semiconductor device. Paths for transmitting ground, power, and signals for operating semiconductor devices may be formed through the metal wiring process. A metal wire may include for example gold, platinum, silver, aluminum, and tungsten.

According to some embodiments, during a semiconductor structure or device manufacturing process, processes such as a planarization process (e.g., a chemical mechanical polishing (CMP) process) and an ion implantation process may also be performed.

Also, the method of manufacturing a semiconductor structure or device according to embodiments of the inventive concepts may include an electrical die sorting (EDS) process, a packaging process, and a package testing process.

The EDS process refers to a process for applying electrical signals to semiconductor devices formed on a substrate and determining whether the semiconductor devices are defective based on signals output from the semiconductor devices in response to the applied electrical signals.

The packaging process may include for example a backgrinding process, a sawing process, a die attaching process, a wire bonding process, a molding process, a marking process, a solder ball mounting process, and an individualization process.

Package tests may include an assembly-out test, a DC test, a burn-in test, a monitoring burn-in test, a post burn-in test, and a final test.

While the inventive concepts have been particularly shown and described with reference to embodiments thereof, it should be understood that various changes in form and detail may be made therein without departing from the spirit and scope of the following claims.

What is claimed is:

1. A method of manufacturing a semiconductor device, the method comprising:
   generating plasma in an amplifying tube by using gas as a gain medium;
   detecting a state of the plasma generated in the amplifying tube;
   determining a virtual laser gain based on the detected state of the plasma;
   controlling the state of the plasma such that the virtual laser gain is within a target range; and
   manufacturing the semiconductor device comprising performing an exposure process on a substrate using a laser beam output from the amplifying tube adjusted to have the virtual laser gain within the target range.

2. The method of claim 1, wherein the generating the plasma comprises:
   supplying a mixed gas comprising carbon dioxide, nitrogen, and helium into the amplifying tube; and
   supplying radio frequency (RF) power such that the mixed gas in the amplifying tube is excited.

3. The method of claim 2, wherein the controlling the state of the plasma comprises controlling the RF power such that the virtual laser gain is within the target range.

4. The method of claim 2, wherein the controlling the state of the plasma comprises controlling fluxes of gases of the mixed gas supplied to the amplifying tube such that the virtual laser gain is within the target range.

5. The method of claim 1, wherein the controlling the state of the plasma comprises controlling pressure in the amplifying tube such that the virtual laser gain is within the target range.

6. The method of claim 5, wherein the controlling the pressure in the amplifying tube comprises controlling a flux controller of a gas supply that supplies mixed gas to the amplifying tube or controlling a vacuum pump connected to an interior of the amplifying tube.

7. The method of claim 1, further comprising generating a laser gain calculation algorithm, wherein the generating the laser gain calculation algorithm comprises:
   generating evaluation plasma in the amplifying tube to output a laser beam;
   detecting an actual laser gain by measuring power of the laser beam with a power meter;

detecting spectrum intensities of respective wavelengths in a spectrum of light emitted from the amplifying tube responsive to the evaluation plasma by using a spectrometer;

generating a plurality of laser gain variable candidates based on intensities of a single wavelength or a combination of two or more wavelengths selected from the detected spectrum intensities of the respective wavelengths; and determining a laser gain variable by analyzing a correlation between respective ones of the plurality of laser gain variable candidates and the actual laser gain, wherein the determining the virtual laser gain is also based on the generated laser gain calculation algorithm.

8. The method of claim 7, wherein, in the determining the laser gain variable, when a ratio between the spectrum intensities generated at two wavelengths selected from the detected spectrum intensities of the respective wavelengths has a correlation equal to or higher than a predetermined percentage value with the actual laser gain, the ratio of the spectrum intensities generated at the two wavelengths is determined as the laser gain variable.

9. The method of claim 8, wherein the two or more wavelengths determined in the determining the laser gain variable comprise a wavelength of a carbon monoxide spectrum and a wavelength of a nitrogen spectrum.

10. The method of claim 7, wherein the exposure process comprises an extreme ultraviolet (EUV) exposure process using EUV light generated by reacting droplets with the laser beam output from the amplifying tube when the virtual laser gain is determined to be within the target range.

11. An extreme ultraviolet (EUV) exposure method comprising:
generating plasma in an amplifying tube to output a laser beam;
detecting an actual laser gain by measuring power of the laser beam with a power meter;
detecting a spectrum of light emitted from the amplifying tube responsive to the plasma by using a spectrometer;
generating a plurality of laser gain variable candidates based on a single wavelength or a combination of two or more wavelengths selected from the spectrum of light detected by the spectrometer;
determining a laser gain variable having a correlation equal to or higher than a predetermined percentage value with the actual laser gain from among the plurality of laser gain variable candidates;
determining a virtual laser gain for the amplifying tube based on the determined laser gain variable; and
performing an EUV exposure using a laser beam output from the amplifying tube adjusted to have the virtual laser gain.

12. The EUV exposure method of claim 11, wherein the plurality of laser gain variable candidates are generated based on spectrum intensities generated at a plurality of wavelengths selected from the spectrum of light detected by the spectrometer.

13. The EUV exposure method of claim 12, wherein the laser gain variable determined in the determining the laser gain variable is a ratio between an amount of light corresponding to a wavelength of 643.6 μm and an amount of light corresponding to a wavelength of 727.6 μm.

14. The EUV exposure method of claim 11, wherein the generating the plasma for comprises:
supplying a mixed gas comprising carbon dioxide into the amplifying tube; and
applying radio frequency (RF) power to an electrode provided in the amplifying tube, such that the mixed gas in the amplifying tube is excited.

15. An extreme ultraviolet (EUV) exposure method comprising:
supplying a mixed gas into an amplifying tube;
generating plasma by applying radio frequency (RF) power to an electrode in the amplifying tube supplied with the mixed gas;
detecting a state of the plasma generated in the amplifying tube;
determining a virtual laser gain based on the detected state of the plasma;
controlling the state of the plasma such that the virtual laser gain is within a target range; and
generating EUV light by reacting droplets with a laser beam output from the amplifying tube when the virtual laser gain is within the target range.

16. The EUV exposure method of claim 15, wherein the controlling the state of the plasma comprises controlling at least one of a source of the RF power, a gas composition of the mixed gas, and pressure in the amplifying tube.

17. The EUV exposure method of claim 15, further comprising generating a laser gain calculation algorithm, wherein the generating the laser gain calculation algorithm comprises:
generating evaluation plasma in the amplifying tube by using the mixed gas to output a laser beam;
detecting an actual laser gain by measuring power of the laser beam generated by the evaluation plasma;
detecting spectrum intensities of respective wavelengths in a spectrum of light emitted from the amplifying tube responsive to the evaluation plasma using a spectrometer; and
determining a laser gain variable having a correlation equal to or higher than a predetermined percentage with the actual laser gain based on an analysis of a correlation between a spectrum intensity of a single wavelength selected from the detected spectrum intensities of the respective wavelengths and the actual laser gain, or an analysis of a correlation between spectrum intensities of a plurality of wavelengths selected from the detected spectrum intensities of the respective wavelengths and the actual laser gain,
wherein the determining the virtual laser gain is also based on the generated laser gain calculation algorithm.

18. The EUV exposure method of claim 17, wherein in the determining the laser gain variable, a ratio between spectrum intensities of two wavelengths from the detected spectrum intensities of the respective wavelengths is determined as the laser gain variable.

19. The EUV exposure method of claim 15, wherein the mixed gas comprises carbon dioxide, nitrogen, and helium, and the laser beam output from the amplifying tube has a wavelength of 10.6 μm.

20. The EUV exposure method of claim 15, wherein the EUV light has a wavelength between 4 nm to 124 nm.

* * * * *